(12) United States Patent
Hashim

(10) Patent No.: US 7,549,890 B2
(45) Date of Patent: Jun. 23, 2009

(54) ALIEN NEXT COMPENSATION FOR ADJACENTLY PLACED CONNECTORS

(75) Inventor: Amid Hashim, Plano, TX (US)

(73) Assignee: Commscope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 11/621,330

(22) Filed: Jan. 9, 2007

(65) Prior Publication Data

US 2007/0111565 A1 May 17, 2007

Related U.S. Application Data

(63) Continuation of application No. 10/831,325, filed on Apr. 26, 2004, now Pat. No. 7,179,115.

(51) Int. Cl.
H01R 11/20 (2006.01)
H01R 4/26 (2006.01)
H01R 4/24 (2006.01)

(52) U.S. Cl. .................................. 439/404; 439/941

(58) Field of Classification Search ............ 439/404, 439/60, 941, 951, 405, 379, 76.1, 676
See application file for complete search history.

(56) References Cited

U.S. PATENT DOCUMENTS

| 6,296,514 | B1 | 10/2001 | Medina et al. |
| 6,305,950 | B1 | 10/2001 | Doorhy |
| 2003/0109174 | A1 | 6/2003 | Korsunsky et al. |
| 2003/0119372 | A1 | 6/2003 | Aekins |
| 2005/0186838 | A1 | 8/2005 | Debenedictis et al. |
| 2005/0207561 | A1 | 9/2005 | Hammond, Jr. |
| 2005/0221678 | A1 | 10/2005 | Hammond, Jr. |

FOREIGN PATENT DOCUMENTS

| DE | 102 42 143 A1 | 3/2004 |
| WO | WO 2005/083844 A1 | 9/2005 |

Primary Examiner—Javaid Nasri
(74) Attorney, Agent, or Firm—Muncy, Geissler, Olds & Lowe, PLLC

(57) ABSTRACT

A connector is provided for compensating crosstalk with respect to an adjacently placed connector. Each of the connectors includes a printed circuit board (PCB), a plurality of pairs of contacts on the PCB, a plurality of pads disposed at edge portions of the PCB for compensating crosstalk, and a plurality of connecting parts for connecting electrically the pads to the pairs of contacts.

19 Claims, 6 Drawing Sheets

US 7,549,890 B2

ALIEN NEXT COMPENSATION FOR ADJACENTLY PLACED CONNECTORS

This application is a continuation of prior application Ser. No. 10/831,325, filed Apr. 26, 2004, now U.S. Pat. No. 7,179.115.

BACKGROUND OF THE INVENTION

1. Field of the Invention

The present invention is related to alien near end crosstalk (NEXT) compensation and, more particularly, to alien NEXT compensation for standalone unshielded twisted pair (UTP) connectors that are adjacently placed.

2. Discussion of the Related Art

Noise or signal interference between conductors of connectors that are adjacently placed is known as alien NEXT. FIG. 1 shows two UTP modular outlet connectors 1 and 2 that are placed side by side, e.g., in a wall outlet. The connectors 1 and 2 are identical to each other and the configuration of such connectors is known.

As shown in FIG. 1, each of the connectors 1 and 2 includes a printed circuit board (PCB) 50, a plurality of insulation displacement contacts (IDCs) 52, and a plurality of spring wire contacts 54 that are disposed above the PCB 50 and appropriately connected to the IDCs 52 by means of conductive traces on the PCB 50. The IDCs 52 on each of the connectors 1 and 2 are grouped into four pairs P1-P4, where each pair is made up of a ring conductor designated by (r) and a tip conductor designated by (t). As is known, the term "ring" refers to the negatively polarized conductor of the pair, while the term "tip" refers to the positively polarized conductor of the pair.

Each of the IDCs 52 includes a top part 52a having a slit 52c therein and a bottom part 52b to be inserted into a corresponding plated through hole 56 disposed within the PCB 50. For the sake of brevity, only one hole 56 is shown in FIG. 1, but the PCB 50 has multiple plated through holes 56 for receiving therein the corresponding bottom parts 52b of the IDCs 52. Generally, the spring wire contacts 54 mate with externally provided connectors, and electrical wires are inserted into the slits 52c of the IDCs 52 as known.

Although effective, a limitation with the configuration of the connectors 1 and 2 is that when they are placed side by side, capacitive coupling and inductive coupling between the IDCs 52 of the two connectors cause alien NEXT. The alien NEXT level is highest between the pairs of the IDCs 52 facing each other in the two connectors. In this example, the alien NEXT level will be highest between the second pair P2 (r2 and t2) of the connector 1 and the first pair P1 (r1 and t1) of the connector 2 and also between the third pair P3 (r3 and t3) of the connector 1 and the fourth pair P4 (r4 and t4) of the connector 2. Such alien NEXT impairs the signals propagating through the connectors. This problem is not limited to the connectors 1 and 2, but is present in other types of connectors when they are placed adjacently without any shielding mechanism.

Therefore, there is a need to suppress or compensate for the alien NEXT in adjacently placed connectors, such that it is reduced to minimal or acceptable levels (e.g., levels that would support 10 gigabit Ethernet) without the need to shield these connectors from each other.

SUMMARY OF THE INVENTION

The present invention provides a connector for compensating crosstalk with respect to an adjacently placed connector. Each of the connectors includes a printed circuit board (PCB), a plurality of pairs of contacts on the PCB, a plurality of pads disposed at edge portions of the PCB for compensating alien crosstalk, and a plurality of connecting parts for connecting electrically the pads to the pairs of contacts. The pads from the two adjacently placed connectors create compensating capacitance/crosstalk which then cancels the alien crosstalk between the connectors. This invention automatically varies the amount of compensating crosstalk generated according to the amount of alien crosstalk present.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 2:
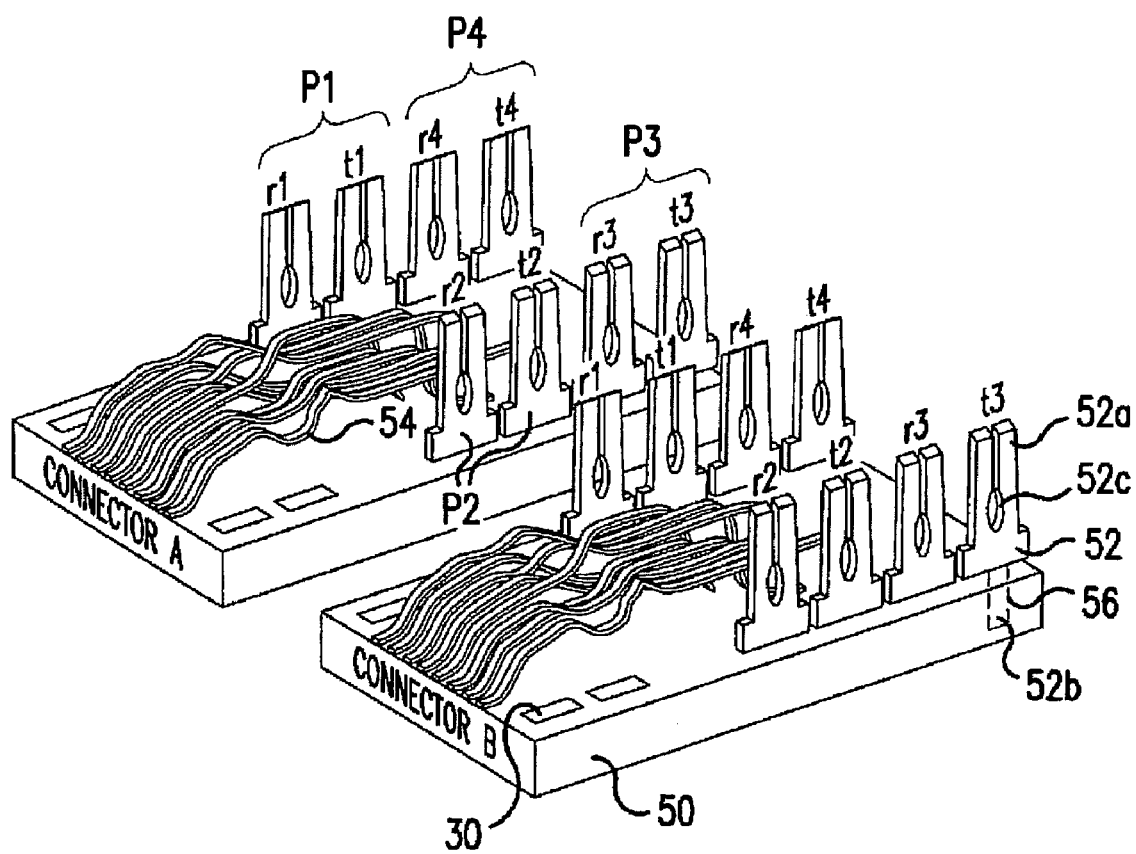
FIG. 2 shows an example of two UTP connectors placed adjacent to each other according an embodiment of the present invention.

FIG. 2 shows an example of two UTP connectors (A and B) placed side by side according to an embodiment of the present invention.

Figure 1:
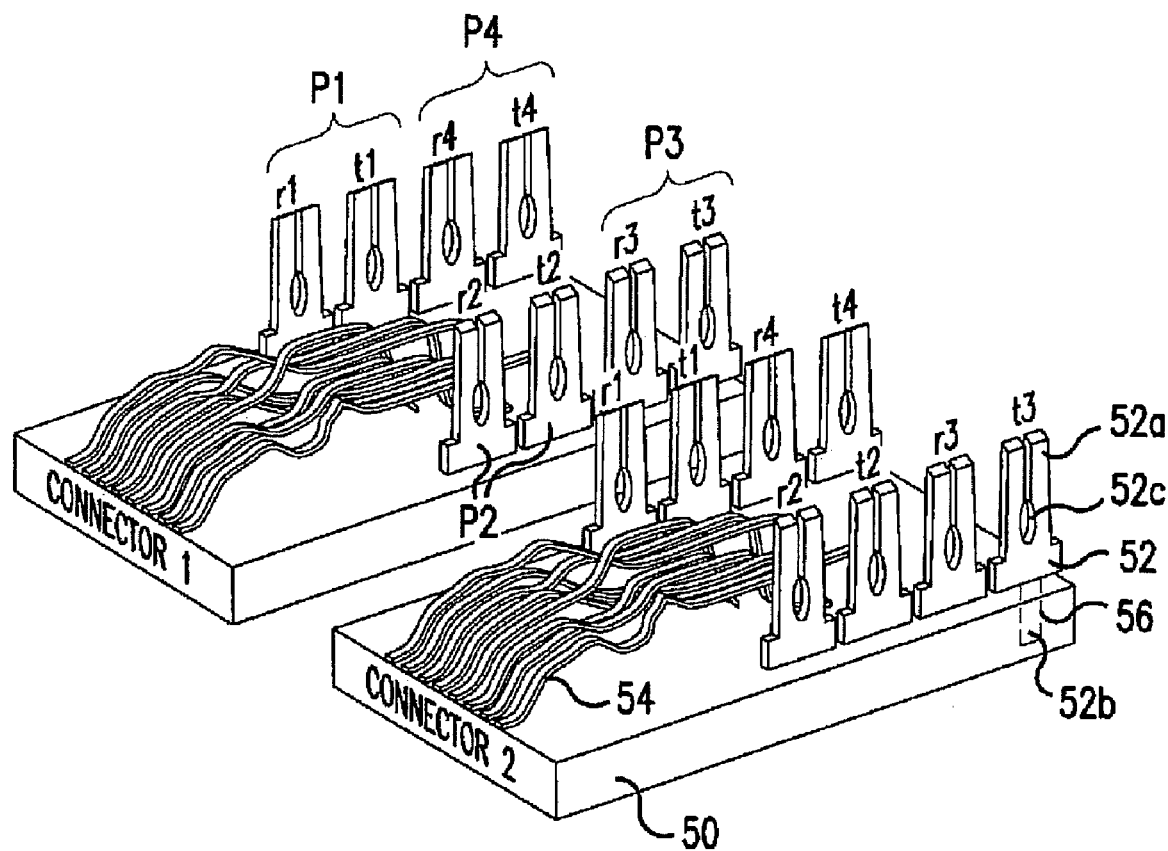
FIG. 1 shows an example of two UTP connectors placed adjacent to each other according to a related art.

As shown in FIG. 2, each of the connectors A and B includes the features of existing UTP connectors such as the IDCs 52 (pairs P1-P4), the PCB 50, the plated through holes 56 and the spring wire contacts 54 as shown in FIG. 1. Each of the pairs P1-P4 is made up of a ring conductor designated by (r) and a tip conductor designated by (t). Connectors A and B are associated with a plurality of conductive elements, such as compensation pads 30 and a plurality of connecting parts 40 (FIG. 3A) for electrically connecting the compensation pads 30 and the IDCs 52 according to the present invention. The compensation pads 30 and the connecting parts 40 are made of conductive materials, such as metal.

Figure 3A:
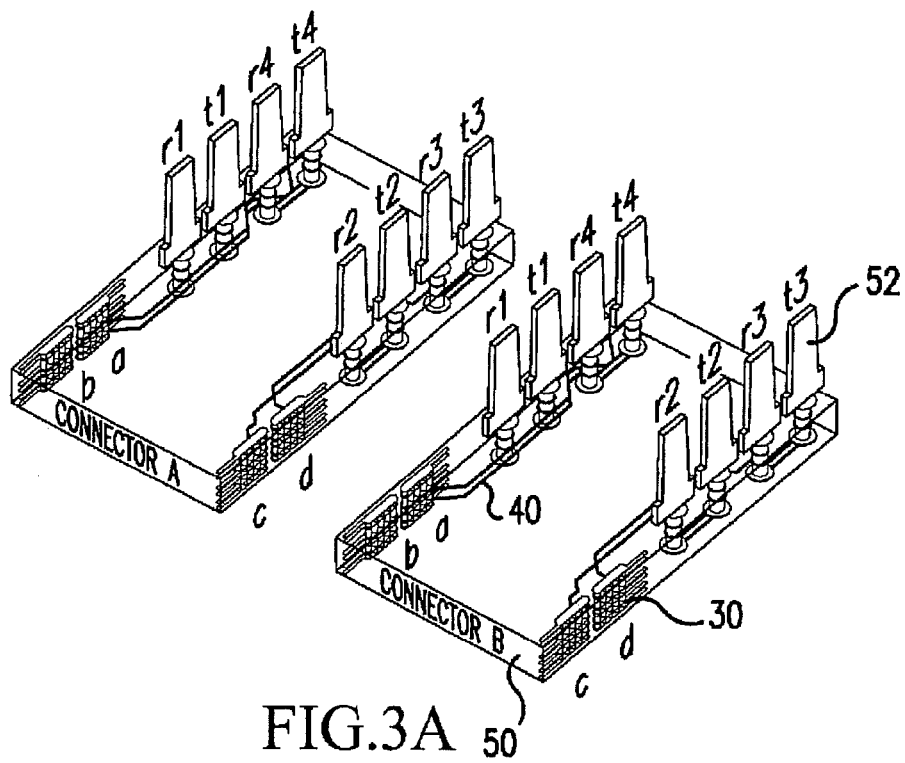
FIG. 3A shows an internal view of the connectors shown in FIG. 2.
Figure 3B:
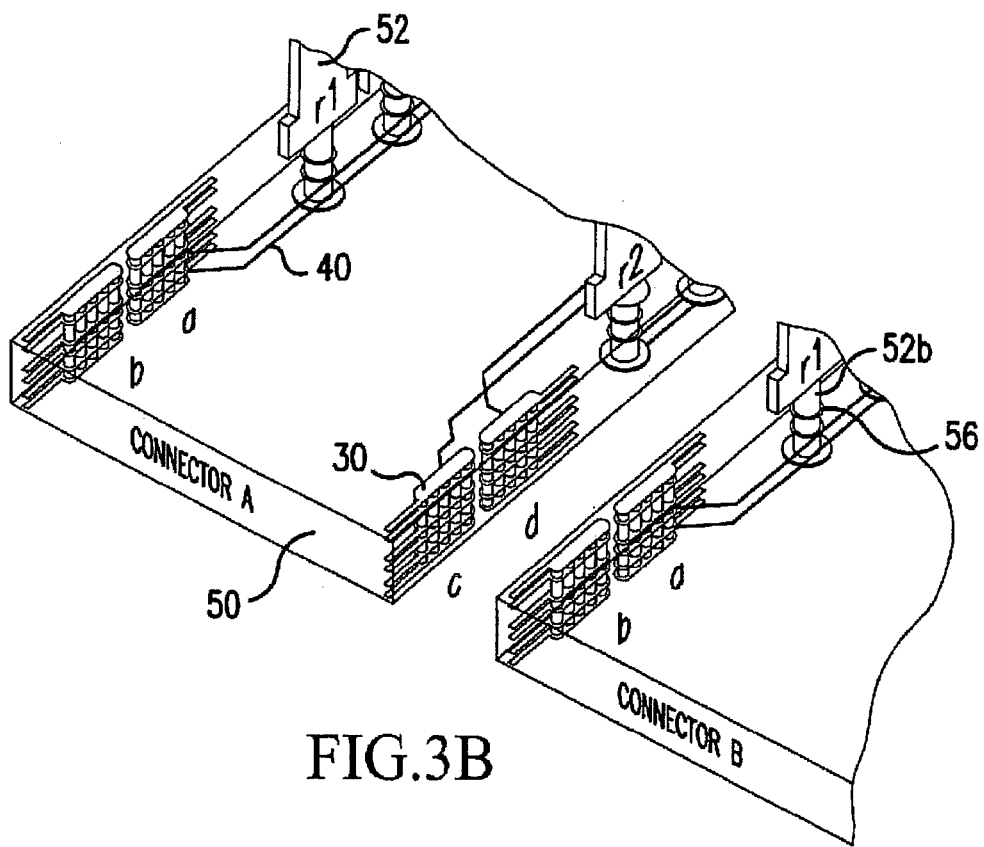
FIG. 3B shows a close-up view of compensation pads of the connectors shown in FIG. 3A.

FIG. 3A shows an internal view of the connectors shown in FIG. 2, and FIG. 3B shows a close-up view of the compensation pads 30 of the connectors shown in FIG. 3A.

As shown in FIGS. 3A and 3B, the compensation pads 30 (a, b, c and d) are placed inside the two opposite edge portions of each of the connectors A and B. Each of the compensation pads 30 can consist of a single metalized layer or of multiple metalized layers stacked above each other and interconnected by an array of plated through holes. The metalized layers of the compensation pads 30 can be disposed correspondingly on the surfaces or within the inner layers of the PCB 50. The top and bottom layers/parts of the compensation pads 30 are visible at the top and/or bottom surface of the PCB 50, whereas all the inner layers/parts of the compensation pads 30 are disposed inside the PCB 50 and cannot be seen from the outside. This configuration is preferable and advantageous because it enables adequate capacitance levels while providing access to the compensation pads 30 from their top and bottom layers/parts for testing purposes. However, it is also possible to internally bury the compensation pads 30 within the edge portions of the connectors such that no part/layer of the compensation pads is visible from the outside of the PCB 50.

The connecting parts 40 can be metal traces on one or different layers of the PCB 50, or can be metal plates or wires disposed on the top and/or bottom surface of the PCB 50. The connecting parts 40 contact the plated through holes 56 associated with the IDCs 52.

The connectors A and B are identical to each other in terms of their structure. For instance, the location of the compensation pads 30 and the specific connections made by the connecting parts 40 in the connector A are identical to those in the connector B such that these connectors can be mass produced easily.

As mentioned above, as the connectors A and B are placed adjacent to each other, alien NEXT is created between the pairs of the IDCs 52 and the alien NEXT level is highest between two pairs of the IDCs 52 that directly face each other. Thus, specific connections that are needed between the compensation pads 30 and the IDCs 52 for compensating the alien NEXT between the third pair P3 of the connector A and the fourth pair P4 of the connector B, which are unlike in pair numbering, is discussed below referring to FIG. 4, as an example only. Obviously, the present invention is not limited to such, and is equally applicable to compensating the alien NEXT between other pairs that are also unlike in pair numbering of the IDCs of adjacently placed connectors. Unlike in pair numbering means different pair numbers, e.g., P2 and P4.

Figure 4:
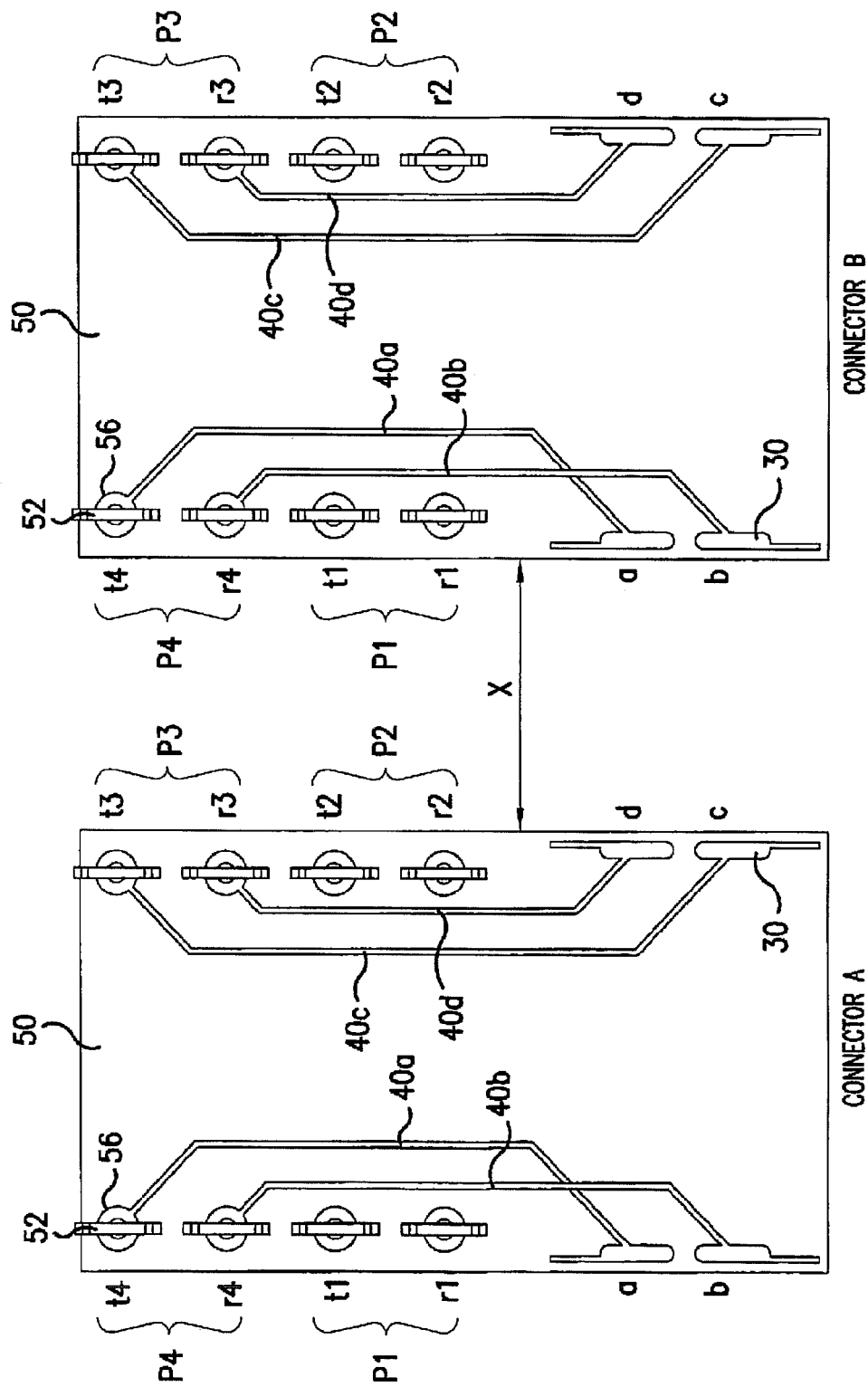
FIG. 4 depicts an example of connections made between the compensation pads and the IDCs of the connectors of FIG. 2 according to the present invention.

FIG. 4 depicts an example of connections made between the compensation pads 30 and the IDCs 52 of the connectors of FIG. 2 according to the present invention.

As shown in FIG. 4, each of the connectors A and B is provided with the first through fourth compensation pads a, b, c and d (30), where the compensation pads a and b are disposed within an edge portion of the connector and the compensation pads c and d are disposed within an opposing edge portion of the connector. The compensation pads a and b in the connector B face respectively the compensation pads d and c in the connector A.

For each of the connectors A and B, the connecting parts 40 include a first connecting part 40a that electrically connects the compensation pad a to the t4 IDC, a second connecting part 40b that electrically connects the compensation pad b to the r4 IDC, a third connecting part 40c that electrically connects the compensation pad c to the t3 IDC, and a fourth connecting part 40d that electrically connects the compensation pad d to the r3 IDC. Such electrical connections are made since the connecting parts 40 contact the appropriate through holes 56.

Since the connectors A and B are placed side by side, alien NEXT of a certain polarity is generated by the proximity of like polarized conductors (tips to tips and rings to rings) at the IDCs 52, namely, in this example, between the t3 IDC of the connector A and the t4 IDC of the connector B, both of the tip polarity, and between the r3 IDC of the connector A and the r4 IDC of the connector B, both of the ring polarity. The present invention allows this alien NEXT to be canceled by the proximity of unlike polarized conductors (rings to tips and tips to rings) at the compensation pads 30, namely, in this example, between the pad d of the connector A, which is of the ring polarity, and the pad a of the connector B, which is of the tip polarity, and between the pad c of the connector A, which is of the tip polarity, and the pad b of the connector B, which is of the ring polarity.

More specifically, capacitance is created between the compensation pad d of the connector A and the compensation pad a of the connector B and between the compensation pad c of the connector A and the compensation pad b of the connector B. Because the compensation pad d of the connector A is electrically connected to the r3 IDC of the connector A, which is of the ring polarity, via the fourth connecting part 40d, and the compensation pad a of the connector B is electrically connected to the t4 IDC of the connector B, which is of the tip polarity, via the first connecting part 40a, the capacitance created between the compensation pad d of the connector A and the compensation pad a of the connector B is in effect a ring to tip capacitance. Likewise, because the compensation pad c of the connector A is electrically connected to the t3 IDC of the connector A, which is of the tip polarity via the third connecting part 40c, and the compensation pad b of the connector B is electrically connected to the r4 IDC of the connector B, which is of the ring polarity, via the second connecting part 40b, the capacitance created between the compensation pad c of the connector A and the compensation b of the connector B is in effect a tip to ring capacitance. This coupling between unlike polarized conductors (rings to tips and tips to rings) at the compensating pads 30 acts to cancel the coupling between like polarized conductors (tips to tips and rings to rings) at the IDCs. Accordingly, the present invention provides an effective way to compensate for the alien NEXT of two adjacently placed connectors.

While the example described above provides cancellation for the alien NEXT between the pair P3 of the connector A and the pair P4 of the connector B, the present invention is not limited to such and can be equally applied to provide alien NEXT cancellation between any other two pairs of IDCs that directly face each other such as the pair P2 of the connector A and the pair P1 of the connector B. This can be accomplished by providing within each of the connectors A and B the following: a connecting part for electrically connecting the compensation pad c to the t2 IDC, a connecting part for electrically connecting the compensation pad d to the r2 IDC, a connecting part for electrically connecting the compensation pad a to the t1 IDC, and a connecting part for electrically connecting the compensation pad b to the r1 IDC.

Figure 5:
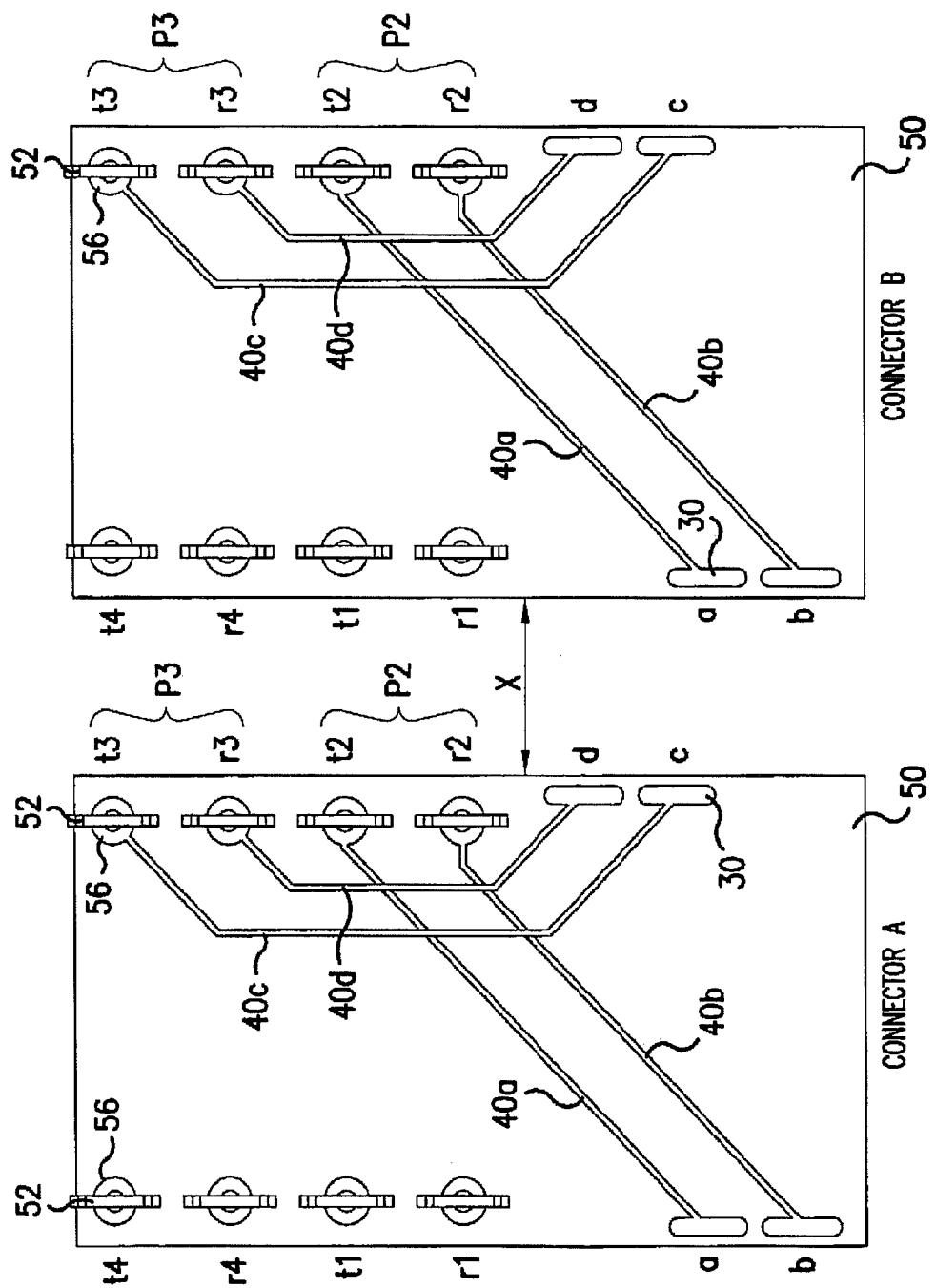
FIG. 5 depicts another example of connections made between compensation pads and IDCs of two adjacently-placed connectors according to the present invention.

Furthermore, the present invention is equally applicable to provide cancellation for the alien NEXT between any of the other pairs of the adjacently positioned connectors, except for the like numbered pairs such as the pair P3 of the connector A to the pair P3 of the connector B. FIG. 5 shows an example of an alien NEXT compensation scheme for compensating the alien NEXT generated by IDCs that do not directly face each other, such as the pair P3 of the connector A and the pair P2 of the connector B. The connectors A and B of FIG. 5 differ from the connectors A and B of FIGS. 2-4 in the connections made by the connecting parts 40a-40d and in the locations of the compensation pads 30.

As shown in FIG. 5, for each of the connectors A and B, the compensation pads 30 are disposed diagonally facing each other at the two opposing edge portions of the connector. The first connecting part 40a electrically connects the compensation pad a to the t2 IDC, the second connecting part 40b electrically connects the compensation pad b to the r2 IDC, the third connecting part 40c electrically connects the compensation pad c to the t3 IDC, and the fourth connecting part 40d electrically connects the compensation pad d to the r3 IDC. The compensation pads a-d are placed at specific locations of the connectors such that the displacement between the pair P3 of the connector A with respect to the pair P2 of the connector B corresponds to the displacement between the compensation pads d and c of the connector A and the compensation pads a and b of the connector B.

The fact that the IDCs of the pair P3 of the connector A diagonally face the IDCs of the pair P2 of the connector B and that the polarities of the individual conductors forming these pairs are similarly sequenced (tip first, ring second in both connectors), gives rise to alien NEXT of a certain magnitude and a certain polarity. While the compensating pads d and c of the connector A diagonally face the pads a and b in the connector B similar to the manner in which IDCs P3 of connector A diagonally face the IDCs P2 of the connector B, the polarities of the individual pads, as determined by the polarities of the IDCs connected to them by means of the connecting parts 40, are oppositely sequenced (ring first, tip second in the connector A, and tip first, ring second in the connector B). This results in the generation of compensation capacitance at the pads 30 having an equal magnitude and opposite polarity to the alien NEXT generated at the IDCs 52.

While the example described above provides cancellation for the alien NEXT between the pair P3 of the connector A and the pair P2 of the connector B, the present invention is not limited to such and can be equally applied to provide alien NEXT cancellation between any other two pairs of IDCs that are diagonally disposed relative to each other such as the pair P2 of the connector A and the pair P3 of the connector B. This can be accomplished by diagonally disposing the pads d and c relative the pads a and b in a manner similar to the way the IDCs P2 of the connector A diagonally face the IDCs P3 of the connector B and providing within each of the connectors A and B the following: a connecting part for electrically connecting the compensation pad c to the t2 IDC, a connecting part for electrically connecting the compensation pad d to the r2 IDC, a connecting part for electrically connecting the compensation pad a to the t3 IDC, and a connecting part for electrically connecting the compensation pad b to the r3 IDC.

Figure 6:
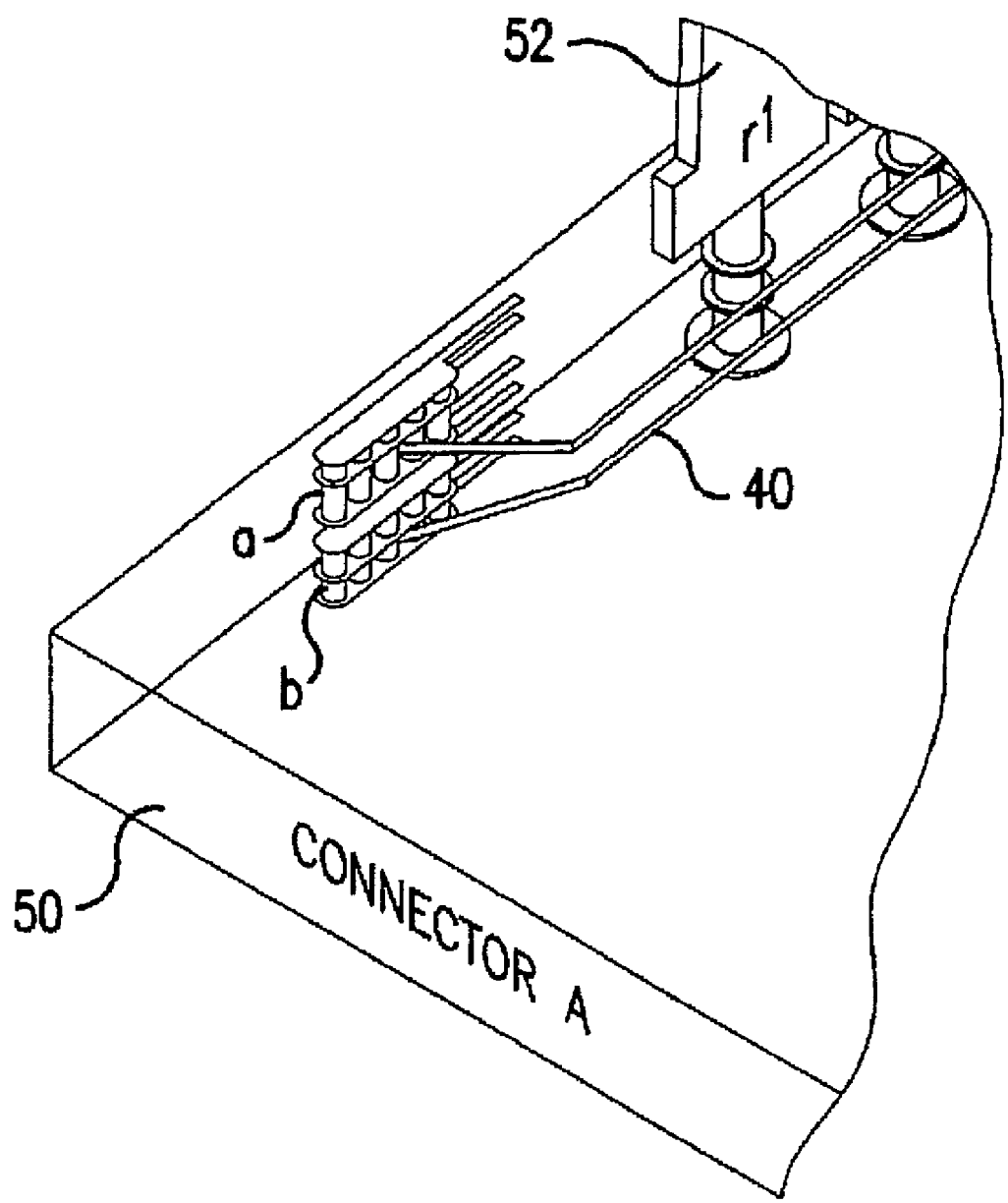
FIG. 6 depicts another example of the configuration of the compensation pads according to the present invention.

As a variation, instead of providing a pair of compensation pads that are adjacent to each other horizontally in a connector as shown in FIGS. 4 and 5, it is possible to provide a pair of compensation pads that are adjacent to each other vertically, for a pair of IDCs. That is, the pair of compensation pads can be stacked above each other without contacting each other. FIG. 6 shows an example of such a configuration. As shown in FIG. 6, for each of the connectors A and B, the compensation pad a can be stacked above the compensation pad b or vice versa.

The present invention is further advantageous because the degree of crosstalk cancellation is self-correcting with respect to any change in the separation distance between the two connectors. According to the unique configuration of the present connectors, both the offending crosstalk (alien NEXT) and the canceling crosstalk (compensation capacitance) increase at the same time as the separation distance between the connectors decreases, and decrease at the same time as the separation distance between the connectors increases. Accordingly, the amount of canceling crosstalk generated is proportionally and automatically adjusted with respect to the amount of alien NEXT present between the connectors.

For instance, in FIG. 4, as the separation distance X between the connectors A and B decreases, the alien NEXT between the pair P3 of the connector A and the pair P4 of the connector B increases. But, the canceling crosstalk is also increased at the same time, because the separation distance between the compensation pads d and c of the connector A and the compensation pads a and b of the connector B is decreased. Therefore, the present invention automatically and correspondingly adjusts the amount of compensation crosstalk that is created in accordance with the amount of alien crosstalk present between the connectors A and B.

According to the present, different embodiments may be combined to provide the desired configuration and design. Further, a feature in an embodiment/example can be replaced with a feature in a different embodiment/example as desired.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A pair of communications connectors arranged in a side-by-side relationship, comprising:
   a first connector having a first contact, a first conductive element coupled to the first contact, a second contact and a second conductive element coupled to the second contact; and
   a second connector having a third contact, a third conductive element coupled to the third contact, a fourth contact and a fourth conductive element coupled to the fourth contact,
   wherein the third contact faces the first contact,
   wherein the fourth contact faces the second contact,
   wherein the first conductive element faces the fourth conductive element, and
   wherein the second conductive element faces the third conductive element,
   wherein the first and second conductive elements are located proximate an edge of the first connector and wherein the third and fourth conductive elements are located proximate an edge of the second connector that directly faces the edge of the first connector.

2. The pair of connectors of claim 1, wherein the first and second contacts comprise a first tip and ring pair, and wherein the third and fourth contacts comprise a second tip and ring pair.

3. The pair of connectors of claim 1, wherein the crosstalk induced between the first and third contacts is approximately cancelled by the crosstalk induced between the first and fourth conductive elements.

4. The pair of connectors of claim 1, wherein the first conductive element is coupled to the first contact via a first trace of a printed circuit board of the first connector, and wherein the second conductive element is coupled to the second contact via a second trace of the printed circuit board of the first connector, and wherein the first and second traces cross over each other on the printed circuit board.

5. The pair of connectors of claim 1, wherein the first, second, third and fourth contacts comprise insulation displacement contacts.

6. A pair of communications connectors arranged in a side-by-side relationship, comprising:
a first connector having a first contact, a first conductive element coupled to the first contact, a second contact and a second conductive element coupled to the second contact; and
a second connector having a third contact, a third conductive element coupled to the third contact, a fourth contact and a fourth conductive element coupled to the fourth contact,
wherein the first and second connectors have the same arrangement of component parts and a first side of the second connector is positioned alongside a second side of the first connector, such that the first and second connectors face a same direction,
wherein the third contact is located proximate a first side of the second connector and the first contact is located proximate a second side of the first connector,
wherein the fourth contact is located proximate the first side of the second connector and the second contact is located proximate the second side of the first connector,
wherein the first conductive element is located proximate the second side of the first connector and the fourth conductive element is located proximate the first side of the second connector, and
wherein the second conductive element is located proximate the second side of the first connector and the third conductive element is located proximate the first side of the second connector.

7. The pair of connectors of claim 6, wherein the first and second contacts comprise a first tip and ring pair, and wherein the third and fourth contacts comprise a second tip and ring pair.

8. The pair of connectors of claim 6, wherein the crosstalk induced between the first and third contacts is approximately cancelled by the crosstalk induced between the first and fourth conductive elements.

9. The pair of connectors of claim 6, wherein the first conductive element is coupled to the first contact via a first trace of a printed circuit board of the first connector, and wherein the second conductive element is coupled to the second contact via a second trace of the printed circuit board of the first connector, and wherein the first and second traces cross over each other on the printed circuit board.

10. The pair of connectors of claim 6, wherein the first, second, third and fourth contacts comprise insulation displacement contacts.

11. The pair of connectors of claim 6, wherein a distance between the third contact and the first contact is about the same as a distance between the fourth contact and the second contact.

12. The pair of connectors of claim 11, wherein a distance between the first conductive element and the fourth conductive element is about the same as a distance between the second conductive element and the third conductive element.

13. A pair of communications connectors comprising:
a first connector having a first contact, a first conductive element coupled to the first contact, a second contact and a second conductive element coupled to the second contact; and
a second connector having a third contact, a third conductive element coupled to the third contact, a fourth contact and a fourth conductive element coupled to the fourth contact, wherein the positioning of the third contact, third conductive element, fourth contact and fourth conductive element on the second connector is the same as the positioning of the first contact, first conductive element, second contact and second conductive element on the first connector,
wherein the pair of communications connectors are arranged side-by-side to face a same direction with an air gap therebetween,
wherein the third contact faces the first contact across the air gap,
wherein the fourth contact faces the second contact across the air gap,
wherein the first conductive element faces the fourth conductive element across the air gap, and
wherein the second conductive element faces the third conductive element across the air gap, wherein the first and second conductive elements are located proximate an edge of the first connector and wherein the third and fourth conductive elements are located proximate an edge of the second connector that directly faces the edge of the first connector.

14. The pair of connectors of claim 13, wherein the first and second contacts comprise a first tip and ring pair, and wherein the third and fourth contacts comprise a second tip and ring pair.

15. The pair of connectors of claim 13, wherein the crosstalk induced between the first and third contacts is approximately cancelled by the crosstalk induced between the first and fourth conductive elements.

16. The pair of connectors of claim 13, wherein the first conductive element is coupled to the first contact via a first trace of a printed circuit board of the first connector, and wherein the second conductive element is coupled to the second contact via a second trace of the printed circuit board of the first connector, and wherein the first and second traces cross over each other on the printed circuit board.

17. The pair of connectors of claim 13, wherein the first, second, third and fourth contacts comprise insulation displacement contacts.

18. The pair of connectors of claim 13, wherein a distance between the third contact and the first contact is about the same as a distance between the fourth contact and the second contact.

19. The pair of connectors of claim 18, wherein a distance between the first conductive element and the fourth conductive element is about the same as a distance between the second conductive element and the third conductive element.

* * * * *